(12) United States Patent
Oishi et al.

(10) Patent No.: US 6,737,918 B2
(45) Date of Patent: May 18, 2004

(54) DISTORTION COMPENSATION APPARATUS

(75) Inventors: Yasuyuki Oishi, Kawasaki (JP);
Tokuro Kubo, Kawasaki (JP); Kazuo Nagatani, Kawasaki (JP); Toru Maniwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/629,134

(22) Filed: Jul. 29, 2003

(65) Prior Publication Data

US 2004/0021516 A1 Feb. 5, 2004

Related U.S. Application Data

(63) Continuation of application No. PCT/JP01/00642, filed on Jan. 31, 2001.

(51) Int. Cl.[7] ............................................. H03F 1/26
(52) U.S. Cl. .............................. 330/149; 330/136
(58) Field of Search ........................ 330/149, 136, 330/151; 375/297, 296; 455/63; 327/307

(56) References Cited

U.S. PATENT DOCUMENTS

| 5,524,286 | A | | 6/1996 | Chiesa et al. | |
| 5,870,668 | A | | 2/1999 | Takano et al. | |
| 5,903,823 | A | | 5/1999 | Moriyama et al. | |
| 6,081,698 | A | | 6/2000 | Moriyama et al. | |
| 6,091,941 | A | | 7/2000 | Moriyama et al. | |
| 6,275,103 | B1 | * | 8/2001 | Maniwa | 330/149 |
| 6,411,944 | B1 | | 6/2002 | Ulyanov | |
| 6,480,705 | B1 | * | 11/2002 | Kusunoki | 455/126 |
| 6,531,917 | B2 | * | 3/2003 | Yamamoto et al. | 330/149 |
| 6,657,493 | B2 | * | 12/2003 | Ode et al. | 330/149 |

FOREIGN PATENT DOCUMENTS

| JP | 08-051320 | 2/1996 |
| JP | 9-69773 | 3/1997 |
| JP | 09-069733 | 3/1997 |
| JP | 09-153849 | 6/1997 |
| JP | 09-294144 | 11/1997 |
| JP | 10-268904 | 10/1998 |
| JP | 2000-156627 | 6/2000 |

* cited by examiner

Primary Examiner—Henry Choe
(74) Attorney, Agent, or Firm—Katten Muchin Zavis Rosenman

(57) ABSTRACT

An input complex base band signal x(t) is complex-multiplied by a distortion compensation coefficient h(p), quadrature-modulated by a quadrature modulator QMOD, and input into a power amplifier AMP. A part of the output from the power amplifier AMP is input into a band pass filter BPF, the band pass filter BPF extracts an adjacent channel leakage power band, and a power detector detects an adjacent channel leakage power value. A distortion compensation coefficient arithmetic unit GA using a genetic algorithm computes a distortion compensation coefficient based on an adjacent channel leakage power value on an adjacent channel leakage power ratio and an input complex base band signal x(t), and outputs a distortion compensation coefficient h(p) as a function of a power value p of the input complex base band signal.

20 Claims, 16 Drawing Sheets

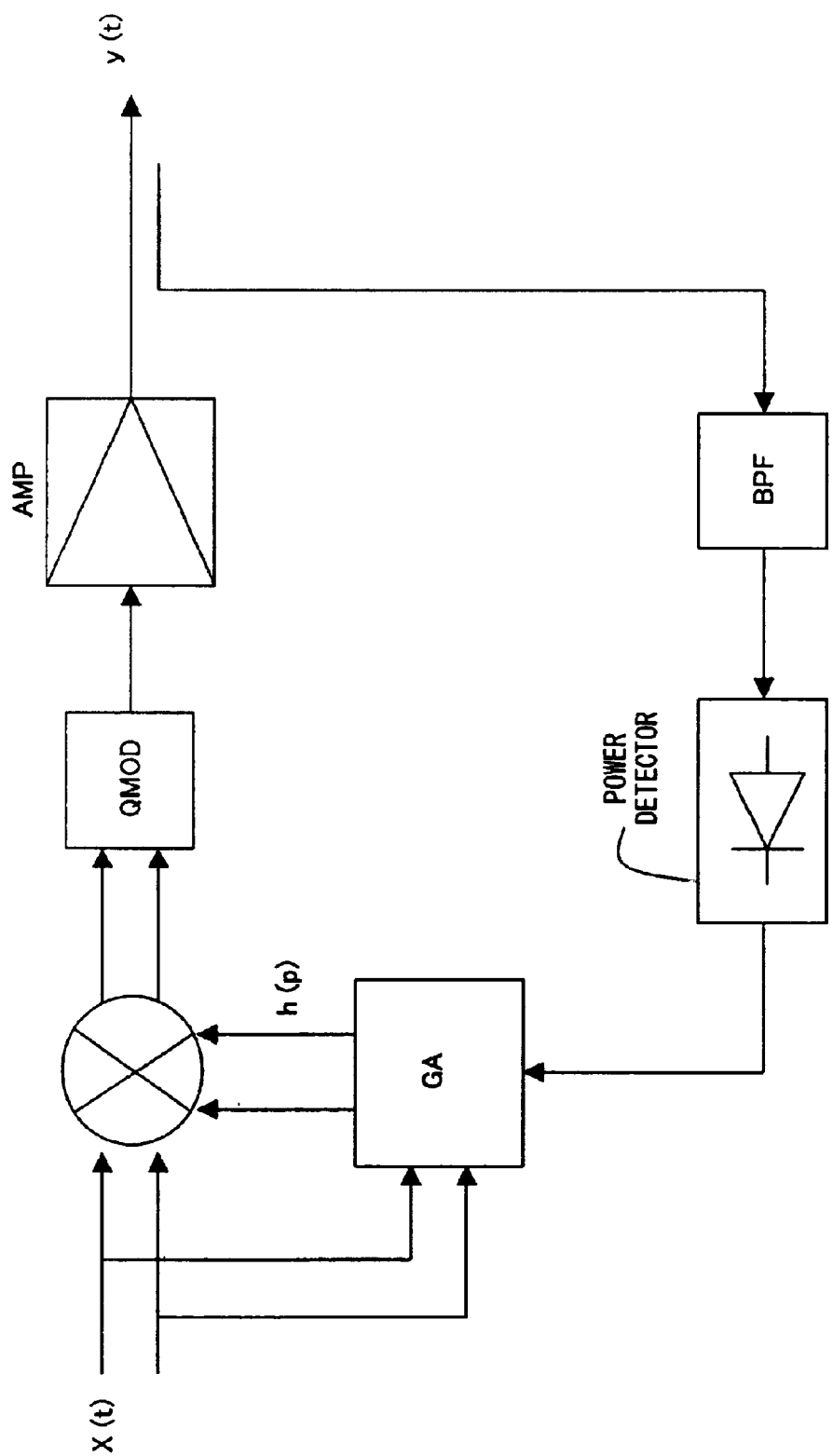
F I G. 2

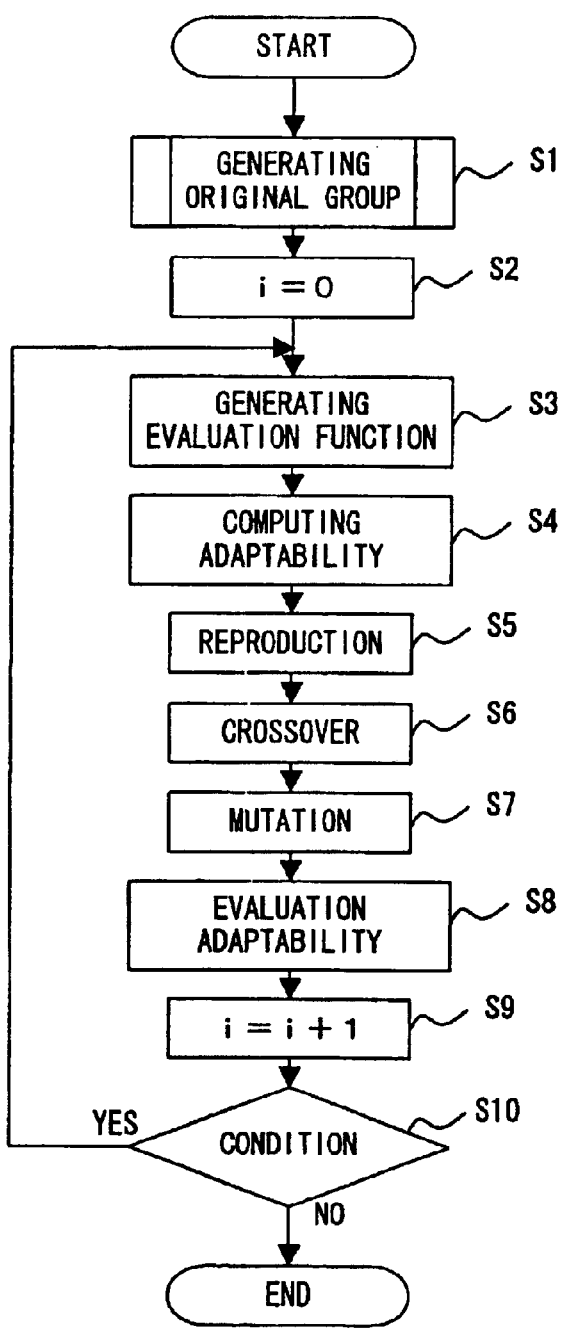
F I G. 4

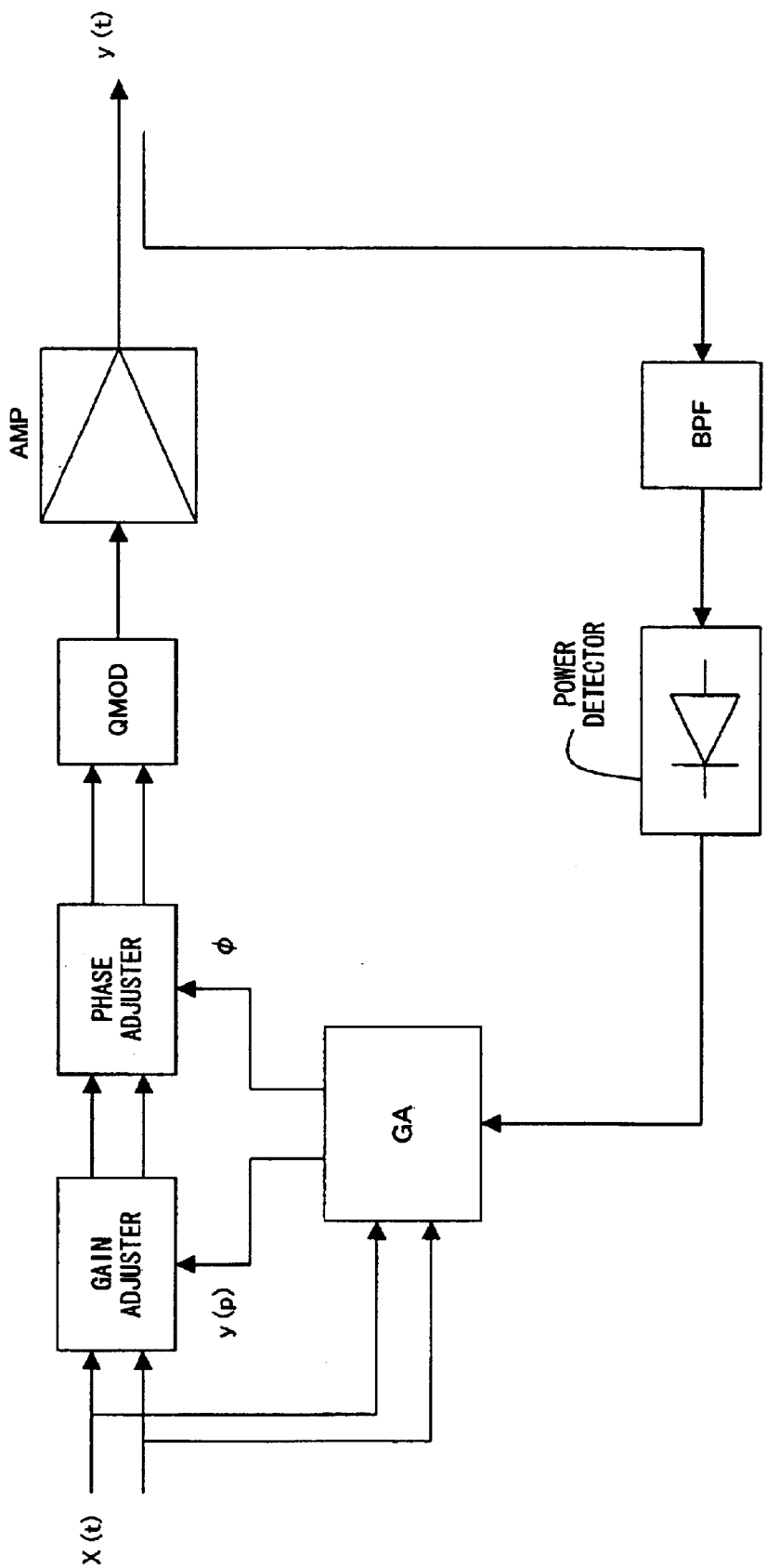
F I G. 9

DISTORTION COMPENSATION APPARATUS

CROSS REFERENCE TO RELATED APPLICATION

This application is a continuation of International PCT Application No. PCT/JP01/00642 filled on Jan. 31, 2001.

BACKGROUND OF THE INVENTION

1. Field of the Invention

The present invention relates to a nonlinear distortion compensation apparatus.

2. Description of the Related Art

A power amplifier for amplifying a linear modulation signal is requested to have high linearity to reduce the deterioration of the transmission characteristic due to a spectrum characteristic and the distortion of a signal. On the other hand, the amplifier is also requested to have high power efficiency in most uses. Normally, the linearity and efficiency are mutually contradictory, and various distortion compensation systems have been developed to make them mutually compatible.

A predistorter system is known as one of the distortion compensation systems. The predistorter system obtains a desired signal without distortion in the output of the amplifier by adding in advance the inverse characteristic of the distortion of the amplifier upon receipt of an input signal of the amplifier.

FIG. 1 shows the distortion compensation apparatus in the conventional predistorter system.

An input complex base band signal x(t) is linearly modulated by a quadrature modulator QMOD after the distortion compensation coefficient h ($|x(t)^2|$) corresponding to its input amplitude or power output from the mean minimum square error (MMSE) device is processed by complex multiplication by a multiplier 1. The modulated signal is amplified by an amplifier AMP, and nonlinear distortion is added to it. A part of an amplifier output signal is demodulated by a quadrature demodulator QDEM to obtain a feedback signal y(t) of a complex base band. The obtained y(t) is compared with an input signal x(t), and the distortion compensation coefficient h is updated such that an error signal e(t)=y(t)−x(t) can be minimized. An update algorithm can be a method of using an MMSE algorithm for minimizing a mean square error of e(t), etc. (Japanese Patent Laid-Open No.9-69733).

In the conventional predistorter system of adaptively obtaining a distortion compensation coefficient, a complex base band signal is required as feedback information for use in generating a distortion compensation table. The precision of the feedback signal greatly affects the spectrum characteristic of the output of the amplifier. In the adaptive predistorter system, a compensation coefficient is controlled such that an error between a reference input complex base band signal and a feedback signal can be minimized. In this case, since the distortion and noise added in the feedback path (a reception mixer, an A/D converter, etc., that is, although not shown in FIG. 1, an A/D converter, a D/A converter, etc. are provided before and after the QMOD and QDEM) cannot be distinguished from the distortion of the amplifier, they cannot be removed in principle. That is, the distortion and noise added in the feedback path are reflected in the distortion compensation coefficient as an error signal, and are superposed on the input signal of the amplifier, thereby reducing the spectrum characteristic of the output of the amplifier.

Especially, when the predistorter system is applied to a power amplifier for amplifying a broadband and highly dynamic range signal such as a W-CDMA, a multi-carrier multiplex signal, etc., it is necessary to include multiples of bands of the input signal for a feedback signal to cover a band of higher order distortion. Therefore, an A/D converter for including the feedback signal is requested to have a characteristic of a high-speed sample and high bit precision. However, a sufficient A/D conversion characteristic cannot be obtained with the current device performance. Thus, the performance of the A/D converter is the bottleneck of restricting the performance of the predistorter.

SUMMARY OF THE INVENTION

The present invention aims at providing a distortion compensation apparatus capable of realizing the control of a predistorter of a high-speed and appropriate amplifier independent of the characteristic of a feedback path.

The distortion compensation apparatus according to the present invention which compensates for the distortion characteristic of an amplifier includes: an adjacent channel leakage power extraction unit for extracting at least adjacent channel leakage power of a main channel signal to be processed in a distortion compensating process from an output signal of the amplifier; a distortion compensation coefficient computation unit for converting the amplitude value and the phase value of a distortion compensation coefficient into respective gene types, and obtaining the distortion compensation coefficient based on the genetic algorithm using the adjacent channel leakage power value or the adjacent channel leakage power ratio obtained from the adjacent channel leakage power value as an evaluation function; and a distortion compensation coefficient application unit for applying a distortion compensation coefficient computed by the distortion compensation coefficient computation unit as an input signal of the amplifier.

According to the present invention, since the adaptive leakage power value or the adjacent channel leakage power ratio can be used in directly computing a distortion compensation coefficient by using the genetic algorithm, the influence of the process error from the A/D converter and demodulator included in the feedback path in the predistorter system can be minimized, thereby computing the distortion compensation coefficient appropriately reflecting the characteristic of the power amplifier.

BRIEF DESCRIPTION OF THE DRAWINGS

FIG. 2 shows the basic configuration of the distortion compensation apparatus of the predistorter system using the GA according to an embodiment of the present invention;

FIG. 4 is a flowchart of the outline of the process of the genetic algorithm (GA);

FIG. 9 shows an example of the first practical configuration of the distortion compensation circuit according to an embodiment of the present invention;

DESCRIPTION OF THE PREFERRED EMBODIMENTS

Figure 1:
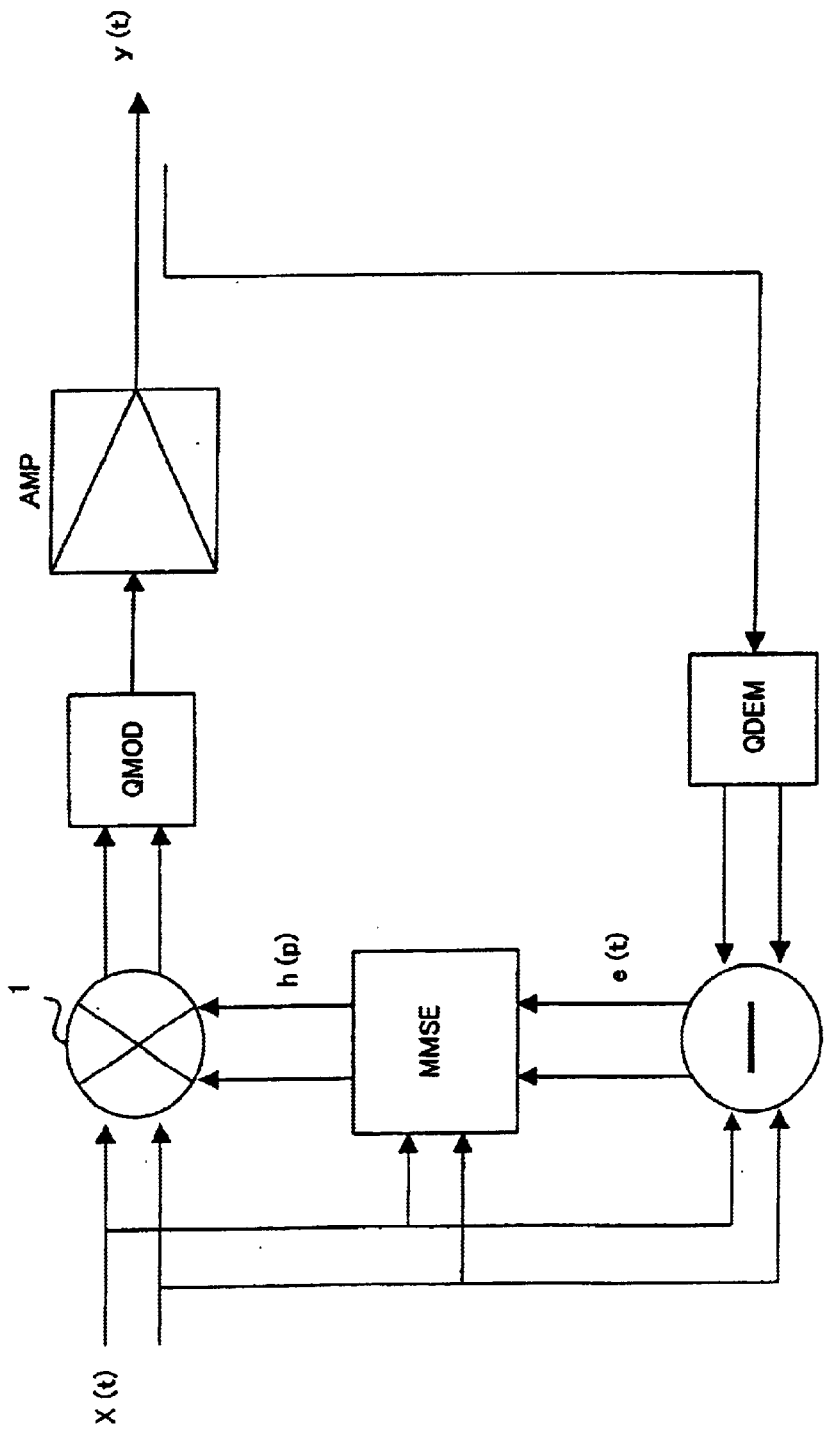
FIG. 1 shows the distortion compensation apparatus in the conventional predistorter system.

According to the present invention, an genetic algorithm (GA) is used in estimating a distortion compensation coefficient of a predistorter. In the GA, the optimum values of the amplitude and phase of the compensation coefficient are searched for by using the adjacent channel leakage power or the adjacent channel leakage power ratio as an evaluation function.

Using the GA in searching for a distortion compensation coefficient, the distortion compensation coefficient can be estimated according to one-dimensional information such as adjacent channel leakage power, etc. as feedback information. Thus, the conventional broadband and high-precision complex feedback signal for determination of the characteristic of the predistorter is not required, and a predistorter having an excellent characteristic can be realized independent of the device performance of an A/D converter.

In estimating the adjacent channel leakage power used as an evaluation function in the GA, the optimum distortion compensation coefficient can be searched for in the genetic algorithm if a relative increase/decrease can be obtained. Therefore, the is power measurement precision does not directly determine the output spectrum characteristic of the amplifier.

FIG. 2 shows the basic configuration of the distortion compensation apparatus in the predistorter system using the GA according to an embodiment of the present invention.

An input complex signal x(t) is assigned the inverse characteristic of the nonlinear distortion of a power amplifier AMP using the distortion compensation coefficient obtained in the GA. The predistortion signal is input into the power amplifier AMP. A part of the output of the power amplifier AMP is fetched, unnecessary radiation power to an adjacent channel band is measured, and the result is fed back as an evaluation function to a GA process unit. That is, the adjacent channel band of a part of the output of the power amplifier AMP is extracted by passing through a band pass filter BPF, and the radiation power is measured in a power detector. Then, the radiation power value is input into the GA (a distortion compensation coefficient computation unit using a genetic algorithm, and is hereinafter referred to simply as GA).

In the GA, the distortion compensation coefficient (complex number) h is expressed as $h = v e^{j\phi}$. The $v$ and $\phi$ respectively indicate an amplitude compensation value and a phase compensation value, and can be respectively obtained as the expressions of the gene type $G_v$ of amplitude and the gene type $G_\phi$ of a phase. The gene types $G_v$ and $G_\phi$ are represented by binary numbers of $n_v$ and $n_\phi$ bits respectively.

$$G_v = \{a_0, a_1, \ldots, a_{n_v-1}\} \quad (1)$$

$$G_\phi = \{b_0, b_1, \ldots, b_{n_\phi-1}\} \quad (2)$$

$$a_i, b_i \in \{0,1\}$$

In this example, there can be respectively $2^{n_v}$ and $2^{n_\phi}$ search spaces in the GA. In the GA, a plurality of search points (an individual having each gene type, and the total number of individuals are predetermined) are distributed in the spaces, and individuals having high adaptability and predominant genes in the succeeding generations survive others according to the rules of the GA, thereby successfully obtaining the optimum value. Each gene type is converted into an expression type by the following equations, and corresponds one to one to a distortion compensation coefficient.

$$v = \frac{g_v}{2^{n_v}} R_{gain} \quad (3)$$

$$\phi = \frac{g_\phi}{2^{n_\phi}} R_{phase} \quad (4)$$

where $g_v$ and $g_\phi$ are the values obtained by converting the bit strings $G_v$ and $G_\phi$ respectively as binary numbers, and $R_{gain}$ and $R_{phase}$ are respectively the maximum value of the amplitude compensation value and the maximum value of the phase compensation value.

An evaluation function can be an adjacent channel leakage power (ACP) or an adjacent channel leakage power ratio (ACPR), etc. as an index of unnecessary radiation power. Adjacent channel leakage power refers to the value of the unnecessary radiation power adjacent to the essential channel power in the search space. Adjacent channel leakage power ratio refers to the ratio of the unnecessary radiation power value to the essential channel power. The ACP and the ACPR in the power amplifier AMP are measured in the predistortion signal using the distortion compensation coefficient depending on the gene type, and the obtained result is defined as an evaluation value $P_{acp}$ for the gene type. An evaluation value is converted into adaptability F by an appropriate scaling operation. Described below is an example of obtaining the adaptability by the following equation from the evaluation value.

$$F = \frac{1.0 \times 10^{-6}}{P_{acp}} \quad (5)$$

In this example, the scaling is performed such that the adaptability of 1 is given when the ACPR is −60 dB (in this case, the numerator in the equation (5) is set to $1.0 \times 10^{-6}$). According to the genetic algorithm, there is a stronger possibility that an individual having a larger adaptability value survives others and maintains its gene in the succeeding generations. That is, the ACPR can be minimized. The obtained adaptability is used as the adaptability of a used gene type in performing the selection, reproduction, etc. of a gene type according to the rules of the GA, and a gene type (the optimum value of the distortion compensation coefficient) having the best ACP and ACPR is searched for.

Figure 3:
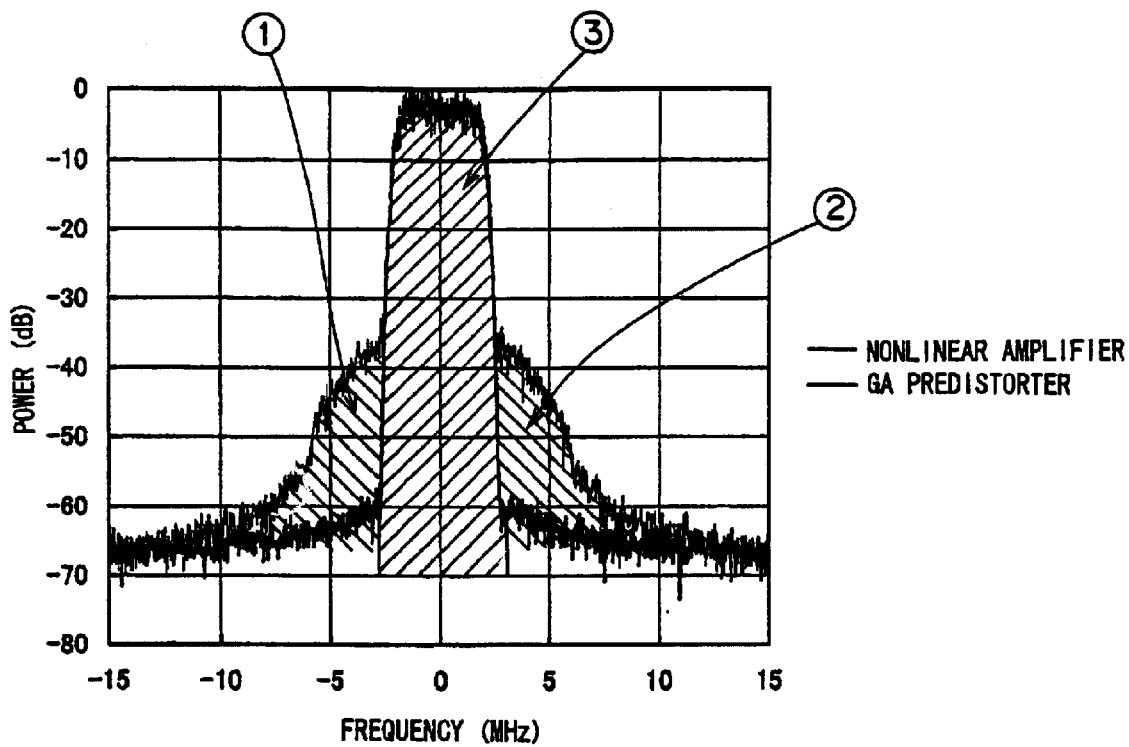
FIG. 3 shows an example of a distortion compensation effect by the predistorter according to the present invention.

FIG. 3 shows an example of a distortion compensation effect by the predistorter according to the present invention.

FIG. 3 shows the spectrum characteristic of the output of the power amplifier. The essential channel power corresponds to the area of the portion indicated by ③, and the adjacent channel leakage power is represented by (area of ①)/(area of ③) or (area of ②)/(area of ③). In FIG. 3, the GA predistorter suppresses the unnecessary radiation to the adjacent channel.

Briefly described below is the genetic algorithm.

The genetic algorithm (GA) is an optimization-search algorithm for quickly obtaining the value of x for the maximum value or the minimum value of the function f(x). The GA is an algorithm as an engineering model based on the evolutionary development of living things, and can be applied to most optimization-search problems including a nonlinear problem. In the GA, a parameter to be optimized is represented as a gene, and the succeeding generations are simulated such that there is a stronger probability that an individual having higher adaptability in the environment (evaluation function) survives others and has descendants, thereby evolving (optimizing the parameter) the gene.

In the GA, when a search space is enormously large, the realistic and optimum solution can be obtained much more quickly than in the system of searching the entire search space. However, since there are a number of uncertain elements in various rules and the method of designing a parameter, it is fundamentally necessary to establish an empirical design by trial and error on a problem to be solved.

FIG. 4 is a flowchart of the outline of the process of the genetic algorithm (GA).

First, an original group is generated in step S1. Then, in step S2, the variable indicating a generation is initialized (i=0). In step S3, an evaluation function is generated for each individual. In step S4, the adaptability of each individual is computed. In step S5, a reproduction process is performed. In step S6, a crossover process is performed. In step S7, a mutation process is performed. The reproduction process is performed to generate the i-th generation to the (i+1)th generation. The crossover process is performed to probably have genes cross according to the crossover rate. The mutation process is performed to probably generate a mutant gene according to the mutation rate. In step S8, the adaptability of an individual of a new generation is evaluated. In step S9, i is increased by 1, and the condition is determined in step S10. As an example of a condition, it is determined whether or not the maximum adaptability is smaller than a set value, whether or not an average adaptability is smaller than a set value, whether or not a generated generation number i is smaller than a set value N, etc.

If the condition determination in step S10 is YES, that is, if the maximum adaptability is smaller than a set value, if the average adaptability is smaller than a set value, if the generation number i is smaller than a set value N, etc., then control is returned to step S3, thereby generating a new generation. If the generation in step S10 is NO, then the process terminates.

The simple GA algorithm is described in more detail below.

(1) Generating Original Groups of Living Things

In the search space, a plurality of search points (individuals having genes) are set. Normally, since a search space is a black box, random numbers are evenly distributed in the space.

(2) Computation of Adaptability of Each Individual

The adaptability f ($I_i$) to the environment of each individual $I_i$ is computed based on a predetermined evaluation function.

(3) Selection and Multiplication

Selection and multiplication are performed in a single process referred to as 'reproduction'. N individuals are selected at random from among the individuals $I_i$ through $I_N$ in the current generation, and N individuals in the next generation are determined.

Here, probability $P(I_i)$, with which an individual $I_i$ is selected as an individual of a next generation, is determined by the next equation.

$$P(I_i) = \frac{f(I_i)}{\frac{1}{N}\sum_{j=1}^{N} f(I_j)} \qquad (6)$$

By the equation (6), the possibility that each individual can exist in the next generation is proportioned to its current adaptability. Therefore, an individual of the higher adaptability has the higher possibility of existence in the next generation. In the reproduction process, the succeeding generations only proceed with the selection of individuals (genes) initially generated at random, but no new search points can be detected. Therefore, the crossover and mutation processes are performed on genes.

(4) Crossover of Genes

M sets of two pairs of individuals are selected at random, and the crossover process is performed on each pair. The probability of occurrence of crossover is referred to as a crossover rate. The crossover is an operation of partially recombining the genes of two individuals in a random position. In a simple GA, a basic one-point crossover process (recombining genes at one point). Described below is an example of a one-point crossover process.

Parent: $G_a$={1100 1010} $G_b$={1110 0111}

Child: $G_{ab1}$={1100 0111} $G_{ab2}$={1110 1010}

(5) Mutation

After the crossover, an operation referred to as mutation is performed. The probability of occurrence of mutation is referred to as a mutation rate. Although there are a number of mutation processes, each bit representing the gene of an individual is inverted according to a mutation rate in the simple GA. This operation can generate an individual having a gene which cannot be generated only by the crossover. From the view point of a search, the mutation corresponds to the occurrence of a new search point, and the algorithm can get out of the local minimum.

(6) Evaluation

It is checked whether or not a newly generated group of living things satisfies a certain evaluation reference. In some uses, a search terminates when the evaluation reference is satisfied. The evaluation reference can be the maximum adaptability in a group, the average adaptability of a group, a change level of adaptability, the frequency of succeeding generations, etc.

References: 'Genetic Algorithm' by T. Agui and Tomoharu Nagao published by (K. K.) Shokodo In the distortion compensation apparatus according to the present embodiment, no evaluation steps are performed in the process procedure of the above mentioned GA, an individual having the maximum adaptability is selected from the obtained group, and the distortion compensation coefficient is determined based on the selection result. By repeatedly performing the process, the convergence of the distortion compensation coefficient into the optimum value is awaited while operating the power amplifier.

In the above mentioned GA predistorter, a target distortion compensation coefficient is obtained corresponding to the input power of $|x(t)|^2$, input amplitude of $|x(t)|$, or their functions $g[|x(t)|^2]$ and $g[|x(t)|]$ (hereinafter collectively represented by an input level). Therefore, the gene type of amplitude/phase corresponding to the distortion compensation coefficient at each point of an input level which is discrete for a digital process is represented by a group of each input level. Each group has the number of gene types set as parameters for respective individuals.

In the adapting operation of gene types in succeeding generations, a prospect is selected from a group of gene types according to an input signal, converted into a corresponding distortion compensation coefficient, and then predistorted. The selection and multiplication processes are performed depending on the adaptability on each group so that the gene types can evolve.

Furthermore, the searching operation starts with the distortion compensation coefficient for an area of a higher input level. When the average value or the maximum value of the adaptability in the area exceeds a predetermined threshold, or when a predetermined frequency of succeeding generations is reached, the search in the area terminates, and is gradually transferred with the distortion compensation coefficient for an area of a lower input level. The process is performed on all input scopes or a necessary scope to obtain the optimum value for the compensation coefficient corresponding to each input level. The obtained distortion compensation coefficient is used as a given compensation coefficient for evaluation of the adjacent channel leakage power at the output of power amplitude when a search in an area of smaller input is carried out.

Normally, the nonlinear distortion of a power amplifier is larger in an area of larger input power, and the resultant deterioration of the spectrum characteristic largely depends on the characteristic of an area of larger input power.

Therefore, the optimum value can be efficiently and stably obtained according to the GA for small input by estimating a distortion compensation coefficient from a large input area and sequentially making an amendment.

That is, although the optimum value for a small input area little affecting an evaluation function is obtained before amending an area greatly affecting the evaluation function, there is a strong possibility that the obtained optimum value becomes invalid when the amendment is made to the large input area. As a result, the problem can be solved by providing a time order in estimating a compensation coefficient for an input level.

In the actual process of optimizing a distortion compensation coefficient, a number of channels are multiplexed as an input signal to a power amplifier like actual communications data using a signal of a large dynamic range with the distortion compensation coefficient optimized by extracting the value for large input, thereby proceeding with the process for smaller input.

In the above mentioned method, after completing the search for the distortion compensation coefficient in the entire area of the input levels, the process of estimating a compensation coefficient is repeated several times from an area of a higher input level. An individual group of each input point maintains the gene type and adaptability at the completion of the previous search for each input, and the optimizing operation is resumed from the state of maintenance each time the process is repeated.

Figure 5:
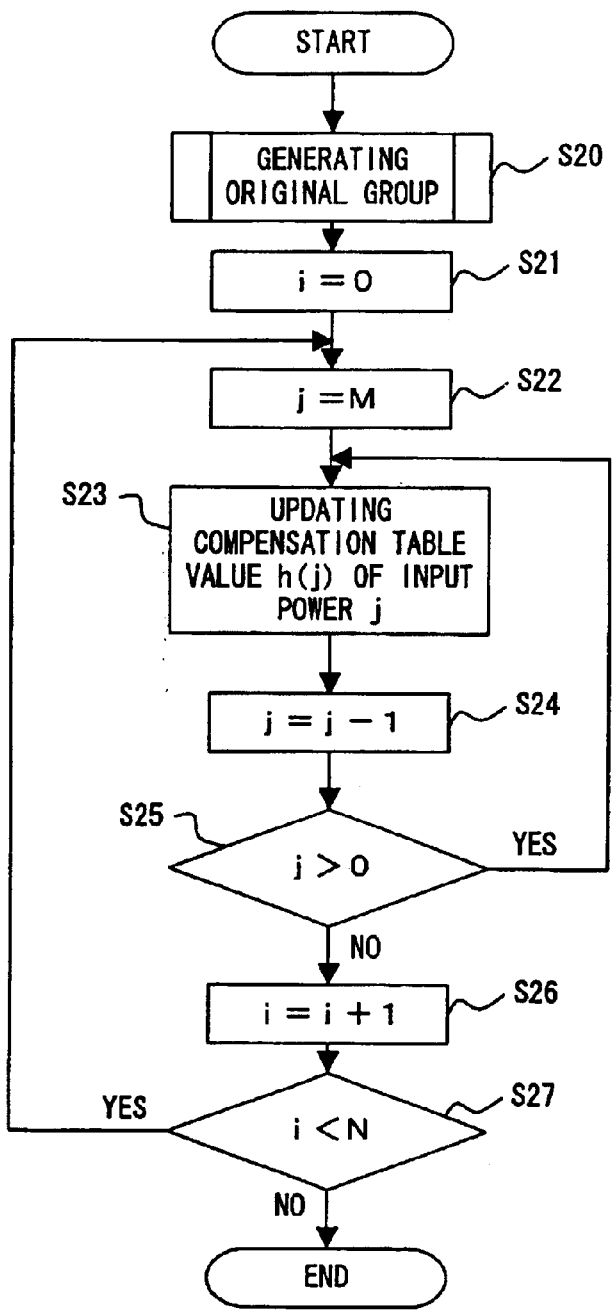
FIG. 5 is a flowchart for explanation of the repeating process.

FIG. 5 is a flowchart of the repeating process.

In step S20, an original group is generated. In step S21, the repetition number i is initialized to 0. In step S22, the variable j indicating an input point is set to M. In step S23, the compensation table value h(j) of the input power j is updated. In step S24, j is decreased by 1. In step S25, it is determined whether j is positive or negative. If it is determined in step S25 that j is positive, then control is returned to step S23. If it is determined in step S25 that j is not positive, then control is passed to step S26, i is increased by 1, and it is determined in step S27 whether or not i is smaller than a predetermined value of N. If i is smaller than N, then control is returned to step S22 to perform the process. If i is not smaller than N, then process terminates. That is, the process is repeated N times.

Figure 6:
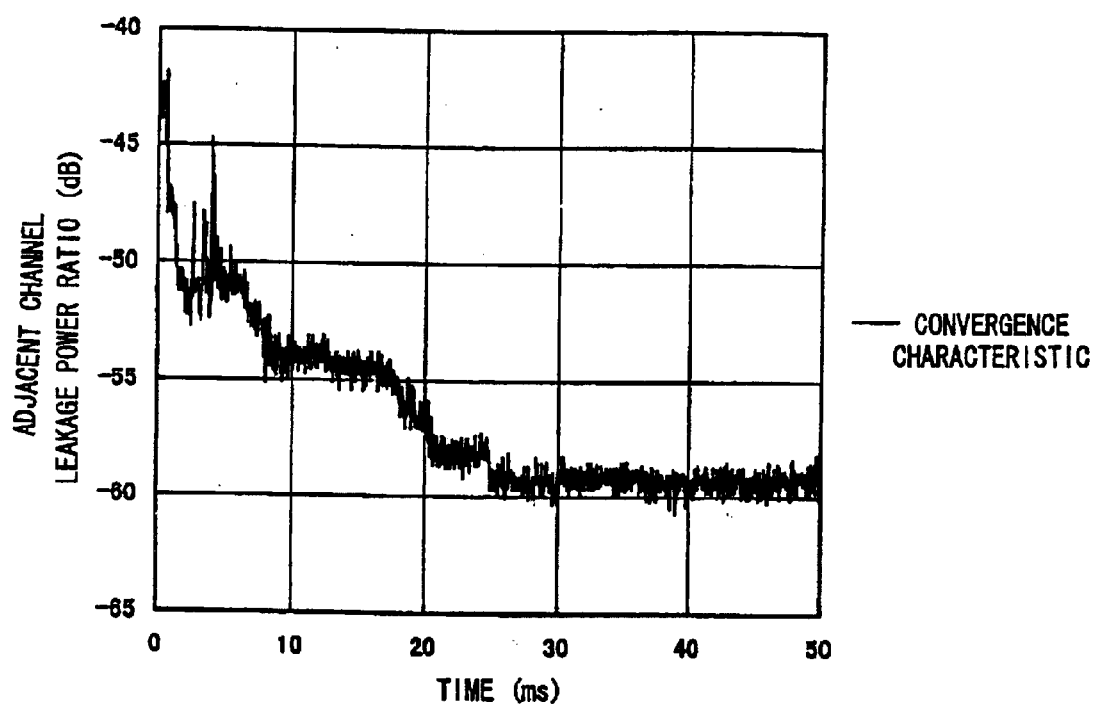
FIG. 6 shows the change of an evaluation function (adjacent channel leakage power ratio) when a distortion compensation coefficient is repeatedly estimated.

FIG. 6 shows the result of a change of an evaluation function (adjacent channel leakage power ratio) when the process of estimating a distortion compensation coefficient is repeatedly performed.

As clearly shown in FIG. 6, the adjacent channel leakage power ratio is stepwise improved with the evolution of the gene type.

Since the optimum point cannot be estimated at the initialization of the individual (search point) at the input point of the largest input power, the search points are distributed at random. On the other hand, the optimum point of the distortion compensation value for the power smaller than the maximum power is possibly close to the already obtained optimum value of the maximum power from the distortion characteristic of a power amplifier.

Therefore, when the optimum value of the distortion compensation coefficient for smaller power is gradually searched for based on the above mentioned characteristic, the gene type assigning the already obtained optimum value of the power immediately before, or the gene type similar to the previous optimum value (for example, a value obtained by superposing the Gaussian distribution to the previous optimum value) is inherited as an initial value, thereby starting the adaptation.

In the above mentioned embodiment, the process of optimizing the distortion compensation coefficient is performed on all input levels. It is also effective to search for the optimum value according to the GA only for the input point at which an input power scope is roughly divided without setting a gene type for all input power when a gene type of amplitude/phase is set for an input level. The interval of each input point is obtained by computing the distortion compensation coefficient in the interpolating process.

For interpolation, a linear interpolation process (first order interpolation) for connecting adjacent points via a straight line, a spline interpolation process for connecting three adjacent points via a cubic curve, etc. can be used.

Figure 7:
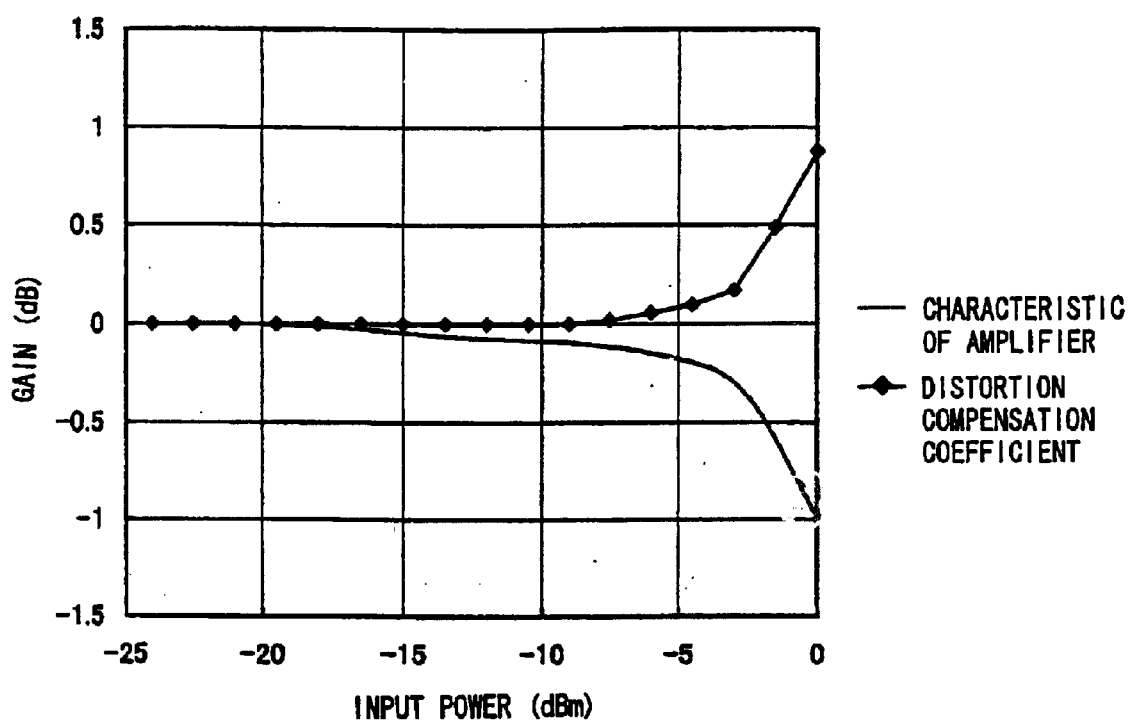
FIG. 7 shows an example of an amplitude compensation value for the input power when a linear interpolation is used.
Figure 8:
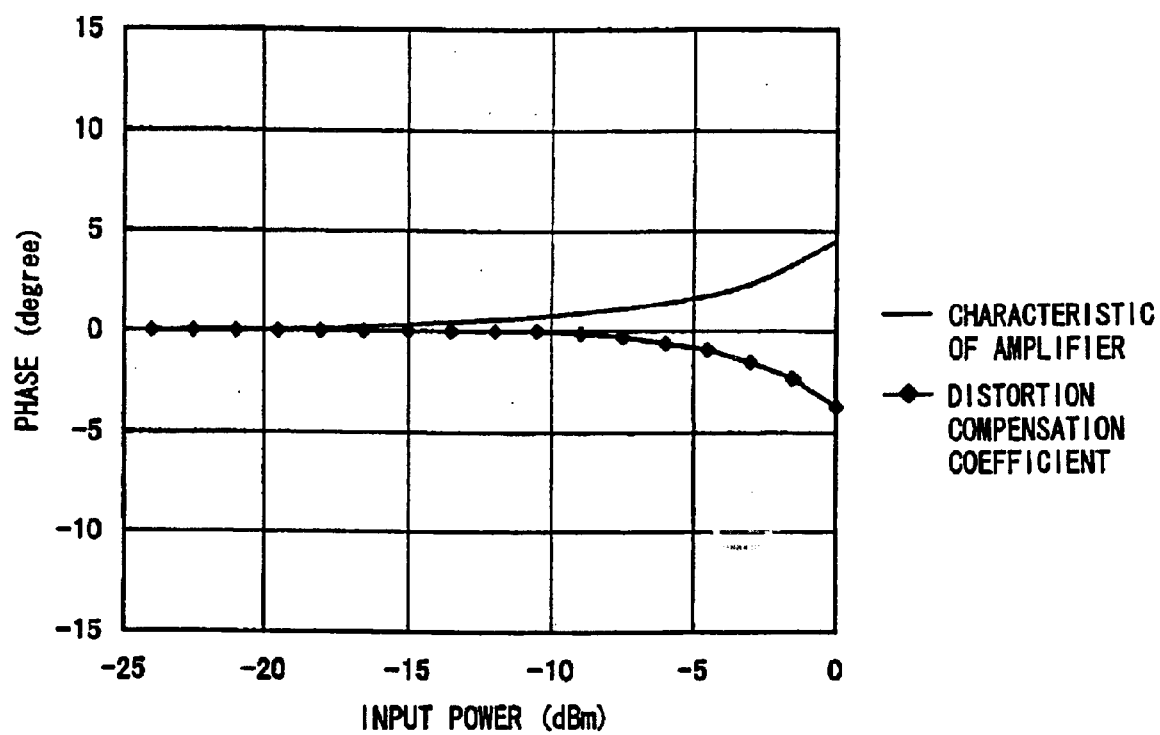
FIG. 8 shows an example of an phase compensation value for the input power when a linear interpolation is used.

FIG. 7 shows an example of an amplitude compensation value for the input power when the linear interpolation is used. FIG. 8 shows an example of a phase compensation value.

In these figures, distortion compensation coefficients are obtained for the amplifier characteristic frequently as indicating inverse characteristics to amplifier characteristics.

Described below is a method of reducing arithmetic operations.

In an area of small input power, a distortion compensation coefficient little affects a spectrum characteristic. That is, a change of adjacent channel leakage power which is the evaluation function of the GA is insensitive to the difference in gene type. Therefore, when the optimum value is searched for in the GA, a number of gene types having similar adaptability are widely distributed, thereby dispersing distortion compensation coefficients.

Therefore, since the amplitude distortion and phase distortion of a power amplifier are normally small in an area of small input power and there is small necessity of compensation, the distortion compensation coefficient for small input power is computed to obtain a gain of 0 dB and a phase of $\phi_0$ ($\phi_0$ indicates the phase deviation around the zero input). For example, the input level scope is divided into two, a distortion compensation coefficient detected in the GA is used for an area of a higher level, and a distortion compensation coefficient obtained in the linear interpolation on the area boundary obtained in the GA and a non compensation state is used. To be more practical, the amplitude compensation value is obtained by performing a linear interpolating process between 0 dB and a boundary value, and the phase compensation value is obtained in a method of commonly using a boundary value in a small input area, etc.

For the level of the input power, an experimentally obtained threshold is set. That is, an area in which the genetic algorithm is effective and an area in which it is ineffective are experimentally obtained, and a threshold is determined. If the input power is smaller than the threshold, the input power itself can be input into the power amplifier. That is, the distortion compensation coefficient can be set to 1.

Furthermore, relating to the predistorter using the GA, the input power, the input amplitude, or the gene type corresponding to the functions can be set. That is, the adaptability of the gene type is improved by simultaneously succeeding generations for the individuals corresponding to each input level. (A gene type does not evolve for each input level as in the above mentioned method) For a generation, there are (number of set individuals)×(input number of divisions) amplitude/phase of gene types, and the predistorting process is performed using the distortion compensation coefficient for each input corresponding to the selected individual. Then, the predistortion signal is power amplified, and adjacent channel leakage power is measured, thereby obtaining an evaluation function of the GA.

FIG. 9 shows an example of a practical configuration of a distortion compensation circuit according to an embodiment of the present invention.

The amplitude amendment value v(p) of the distortion compensation coefficient $h(p)=ve^{j\phi}$ corresponding to the input power $(p=|x(t)|^2)$ obtained by the GA from the input power input from the power detector to the GA is set in the gain adjuster, and the phase amendment value $\phi(p)$ is set in the phase shifter. Thus, a signal u(t)=h(p) x(t) is obtained by predistorting an input signal x(t), and the obtained signal is input into the power amplifier AMP.

In this example, the distortion compensation coefficient $h(|x(t)|^2)$ corresponding to the input power is used. However, the configuration in which the distortion compensation coefficient $h(|x(t)|)$ corresponding to the input amplitude can be used, and the configuration in which the distortion compensation coefficient h [g(|x (t)|)], and $h[g(|x(t)|^2)]$ corresponding to the functions can also be used.

In this example, the GA serially computes the distortion compensation coefficients. Practically, when a power amplifier enters a stable operation, the distortion compensation coefficients are held as a table so that the distortion compensation can be performed by reading a distortion compensation coefficient from the table. In this case, since the characteristic change by the change of the temperature and voltage of the power amplifier is followed, it is necessary for the GA to monitor the change of the characteristic of the power amplifier. It is common among the examples of practical configurations described below.

Figure 10:
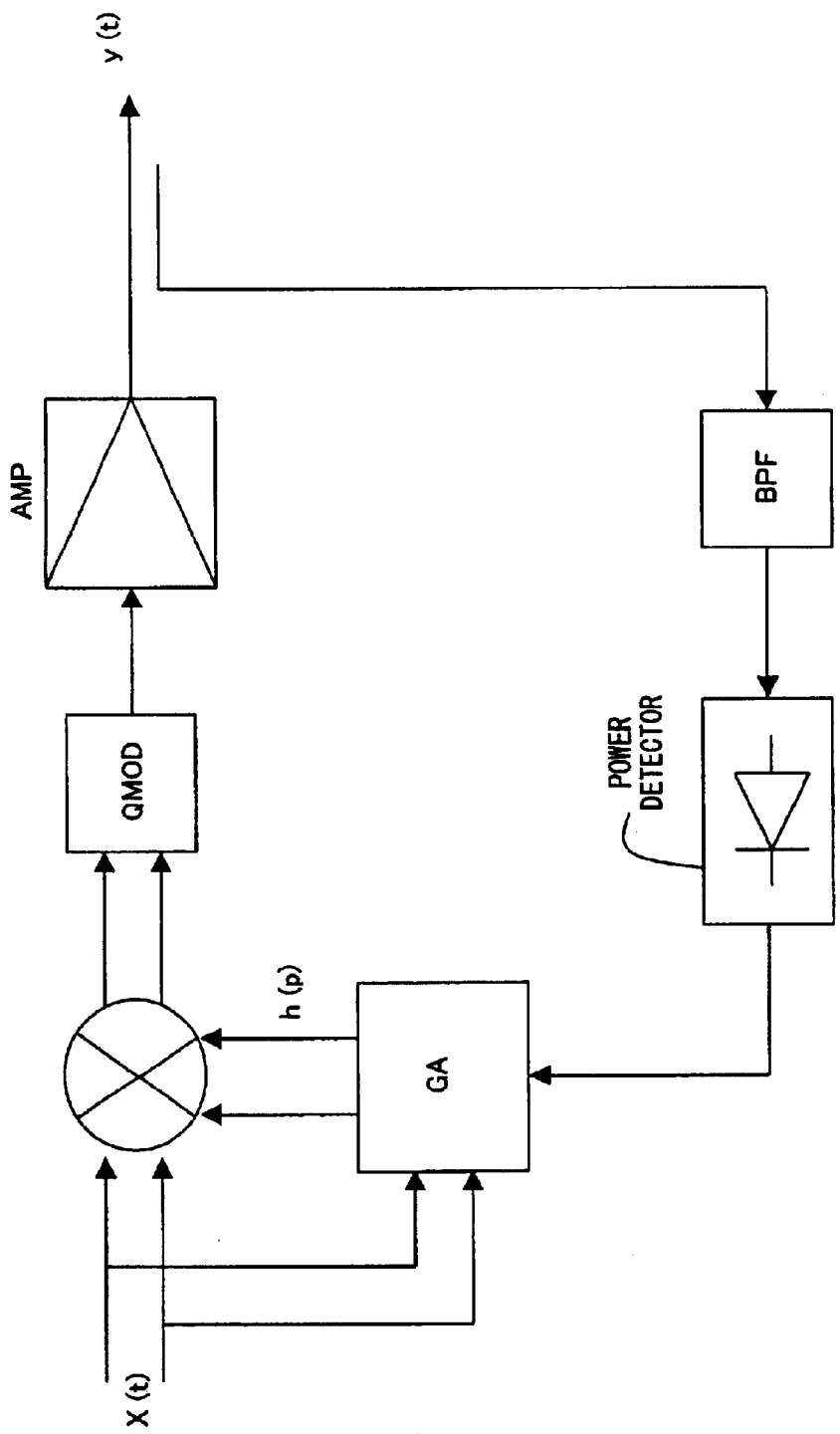
FIG. 10 shows an example of the second practical configuration of the distortion compensation apparatus according to an embodiment of the present invention.

FIG. 10 shows an example of the second practical configuration of the distortion compensation apparatus according to an embodiment of the present invention.

In this practical example, the output of the power amplifier AMP passes through the band pass filter BPF after or before it is converted, only the adjacent channel leakage power components are extracted, and detected by the power detector. The power detector is indicated by the same symbol as in FIG. 9. The power detection can be performed after and before the digital conversion, but it is necessary to perform the digital conversion before a power value is input into the GA. Upon receipt of a power value from the power detector, the GA obtains the distortion compensation coefficient from the table generated in the distortion compensation coefficient generating process using the GA in advance also using the input signal x(t), and multiplies the input signal x(t) by the distortion compensation coefficient $h(p)=ve^{j\phi}$ using a complex multiplier, thereby generating a predistortion signal u(t)=h(p) x (t).

Figure 11:
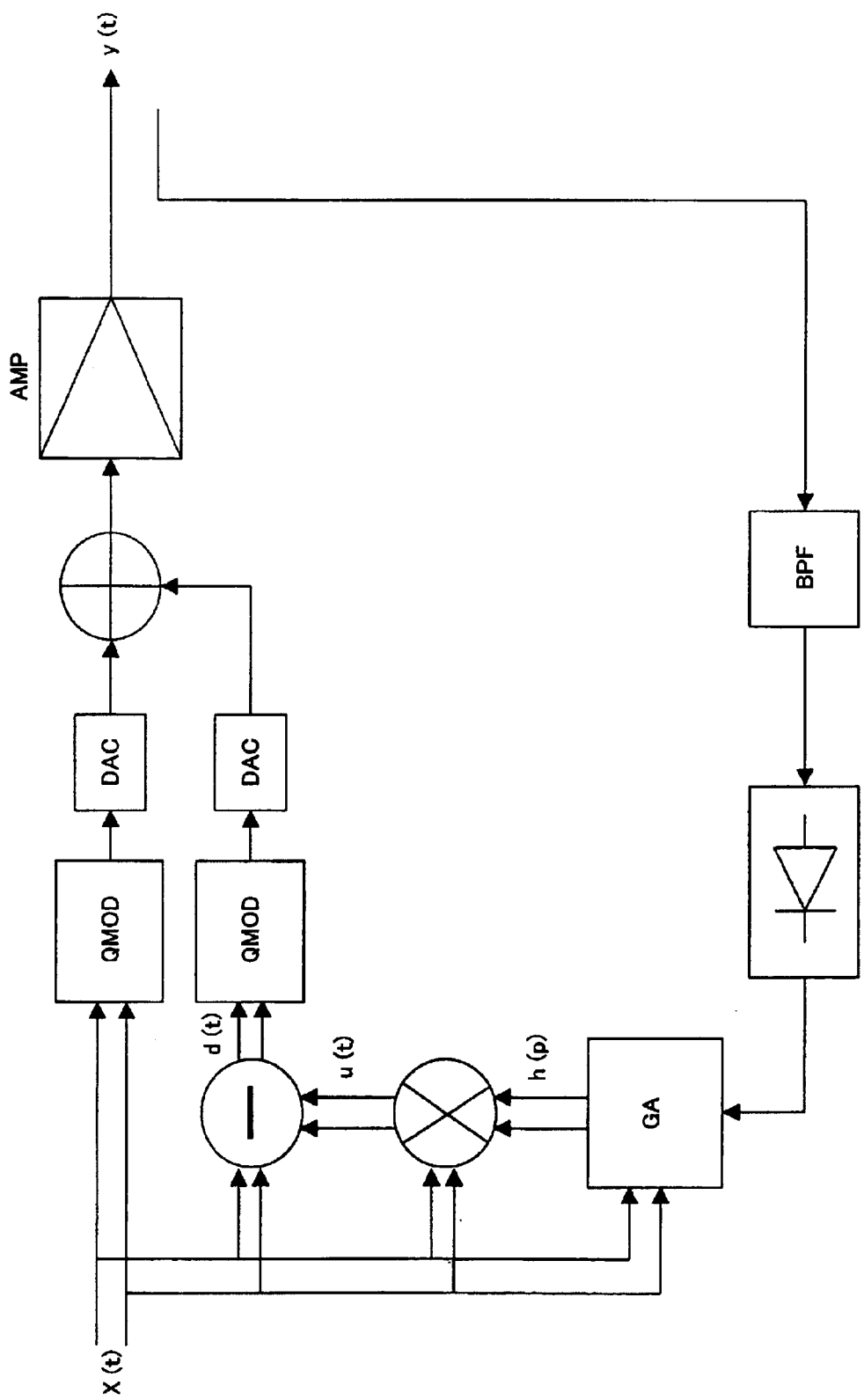
FIG. 11 shows an example of the third practical configuration of the distortion compensation apparatus according to an embodiment of the present invention.

FIG. 11 shows an example of the third practical configuration of the distortion compensation apparatus according to an embodiment of the present invention.

In the present embodiment, a complex multiplication is performed by complex-multiplying an input signal x(t) by a distortion compensation coefficient $h(p)=ve^{j\phi}$, thereby generating a predistortion signal u(t)=h(p) x (t). The difference signal d(t)=u(t)−x(t) between u(t) and x(t) is obtained. The obtained x(t) and d(t) are output by the respective D/A converters, combined after being converted into analog signals, thereby obtaining a predistortion signal.

With the above mentioned configuration, since the original input signal x(t) and difference signal d(t) are output through the respective D/A converters, the dynamic ranges of the D/A converters can be effectively used. The u(t) whose signal amplitude is increased through the predistortion can enlarge the dynamic range of an output signal as compared with the configuration in which signals are output by one D/A converter. Therefore, when the bit precision of the D/A converter is finite, the output signal S/N ratio depending on the quantized noise can be improved.

Figure 12:
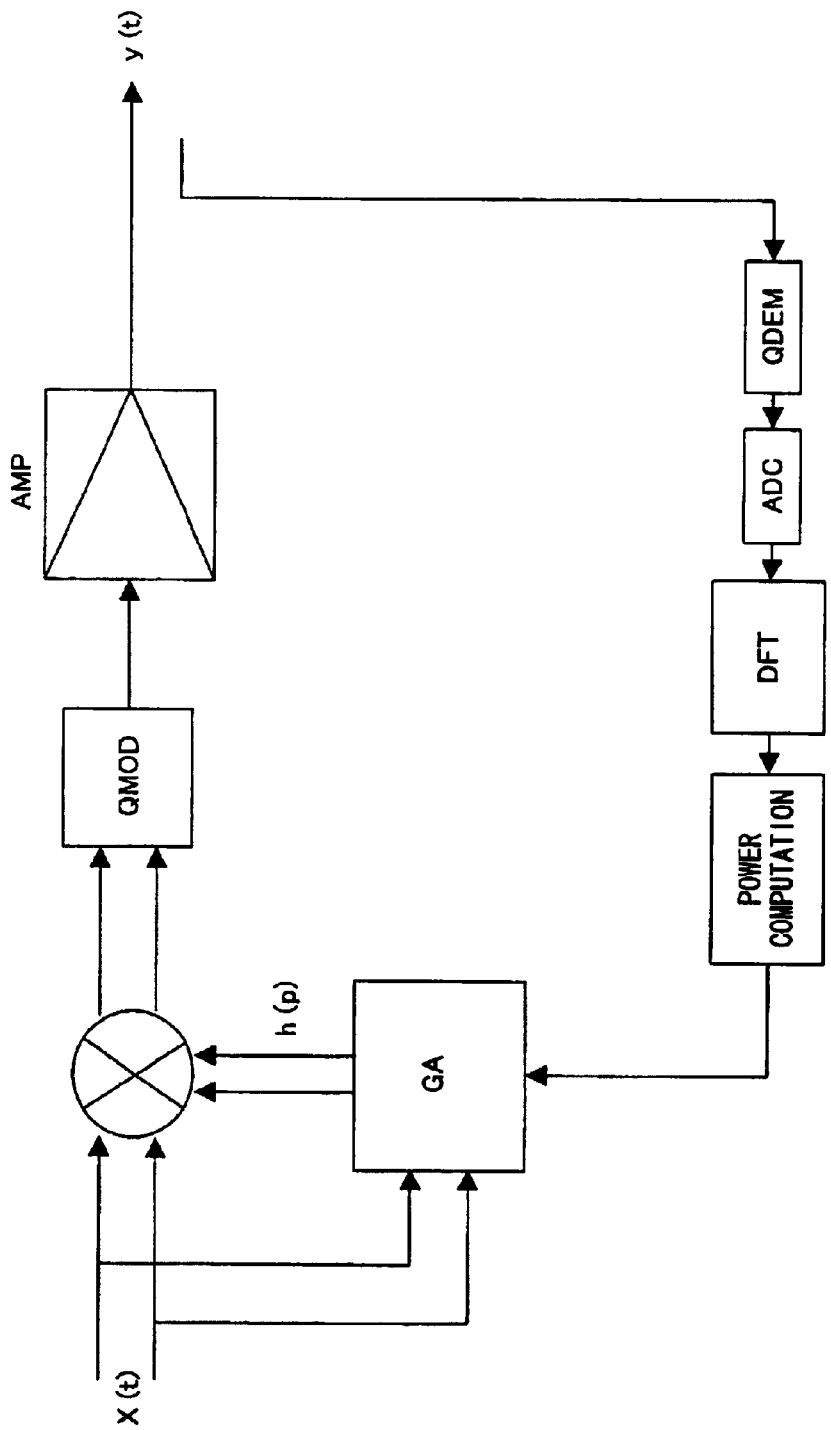
FIG. 12 shows an example of the fourth practical configuration of the distortion compensation apparatus according to an embodiment of the present invention.

FIG. 12 shows an example of the fourth practical configuration of the distortion compensation apparatus according to an embodiment of the present invention.

According to the present embodiment, a part of the output of the power amplifier AMP is demodulated by the quadrature demodulator QDEM to obtain a complex base band signal. The signal is appropriately divided into blocks, and is converted into a signal of a frequency area by a Fourier transform DFT (FFT). The computation is performed by selecting and adding the power of the adjacent channel leakage power band in the frequency area, and the adjacent channel leakage power or the adjacent channel leakage power ratio to be used as an evaluation function of the GA is obtained.

According to the above mentioned practical example, the output of the power amplifier AMP is temporarily demodulated as in the conventional method to be A/D converted (ADC). Therefore, although an error of the A/D conversion and demodulating process can be included in the feedback loop according to the present embodiment, the feedback data input into the GA is a relative size either adjacent channel leakage power which is represented by a scalar value or adjacent channel leakage power ratio. As a result, the process error generated in the demodulating process or the A/D conversion does not directly affect the transmission spectrum. Therefore, unlike the conventional technology, the difference value of the complex base band signal is not used directly in computing the distortion compensation coefficient, but the adjacent channel leakage power or the adjacent channel leakage power ratio is used in computing the distortion compensation coefficient, thereby obtaining a distortion compensation coefficient correctly reflecting the characteristic of the power amplifier AMP with little influence of an error included in the feedback loop.

Figure 13:
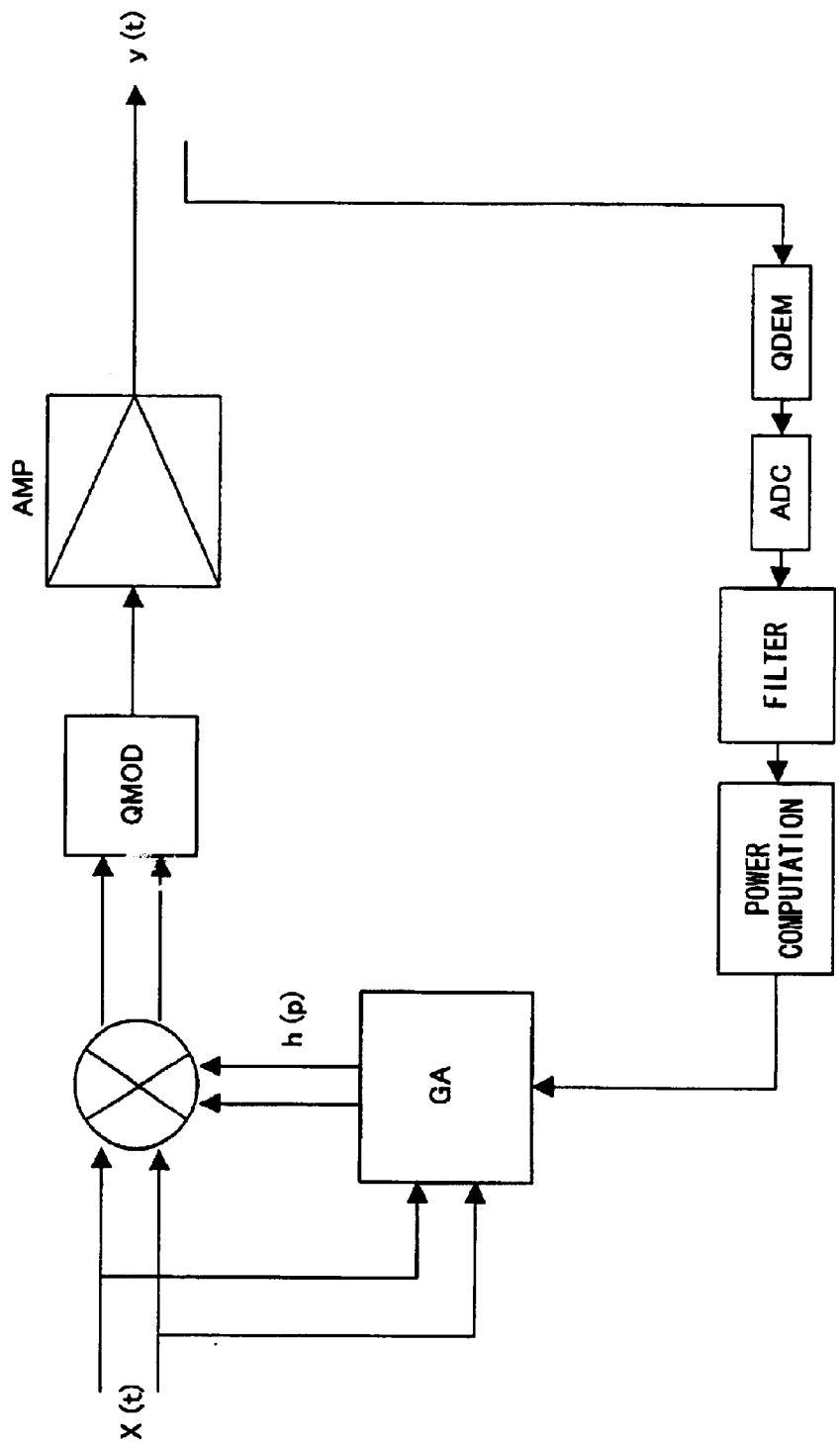
FIG. 13 shows an example of the fifth practical configuration of the distortion compensation apparatus according to an embodiment of the present invention.

FIG. 13 shows an example of the fifth practical configuration of the distortion compensation apparatus according to an embodiment of the present invention.

In the practical example, a part of the output of the power amplifier AMP is demodulated by the quadrature demodulator QDEM to obtain a complex base band signal. Thus, the power is computed by extracting a signal of the adjacent channel leakage power band through an appropriate digital filter, and the adjacent channel leakage power or the adjacent channel leakage power ratio to be used as a evaluation function of the GA is obtained.

In this case, for the same reason as in the fourth practical example, an advantageous effect can be obtained unlike the conventional technology.

Figure 14:
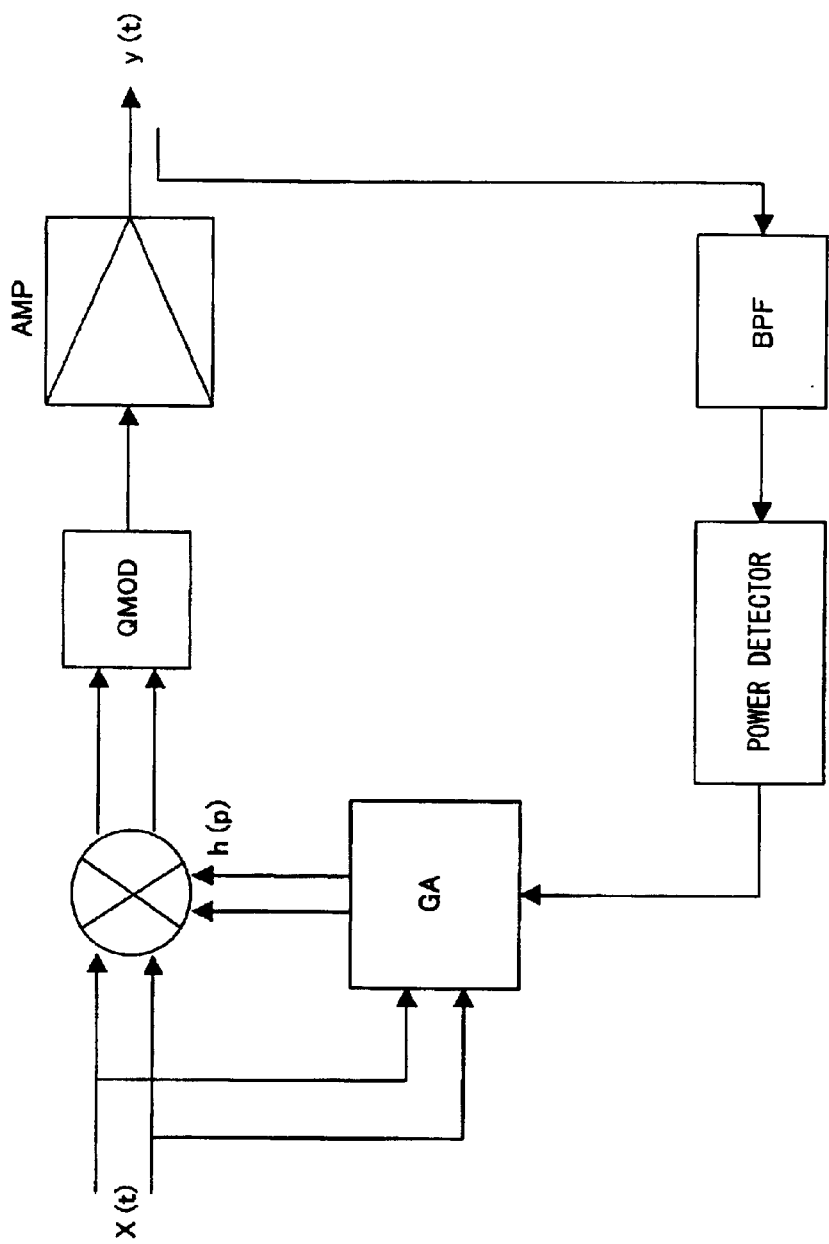
FIG. 14 shows an example of the sixth practical configuration of the distortion compensation apparatus according to an embodiment of the present invention.

FIG. 14 shows an example of the sixth practical configuration of the distortion compensation apparatus according to an embodiment of the present invention.

According to a practical example, a part of the output of the power amplifier AMP is received, and a signal of the adjacent channel band is extracted through a band pass filter (BPF). The power $P_{acp}$ of the BPF output is measured using the power detector to obtain a feedback signal to the GA. The power detector can be a square detector using a diode, an RSSI (received signal strength indicator) signal of the general purpose reception IC, etc., but is not limited only to them.

The power value which is a feedback signal to the GA can be an analog value, but it is desired that the power value is converted into a digital signal immediately before the GA. It is obvious that the GA includes an A/D converter.

Figure 15:
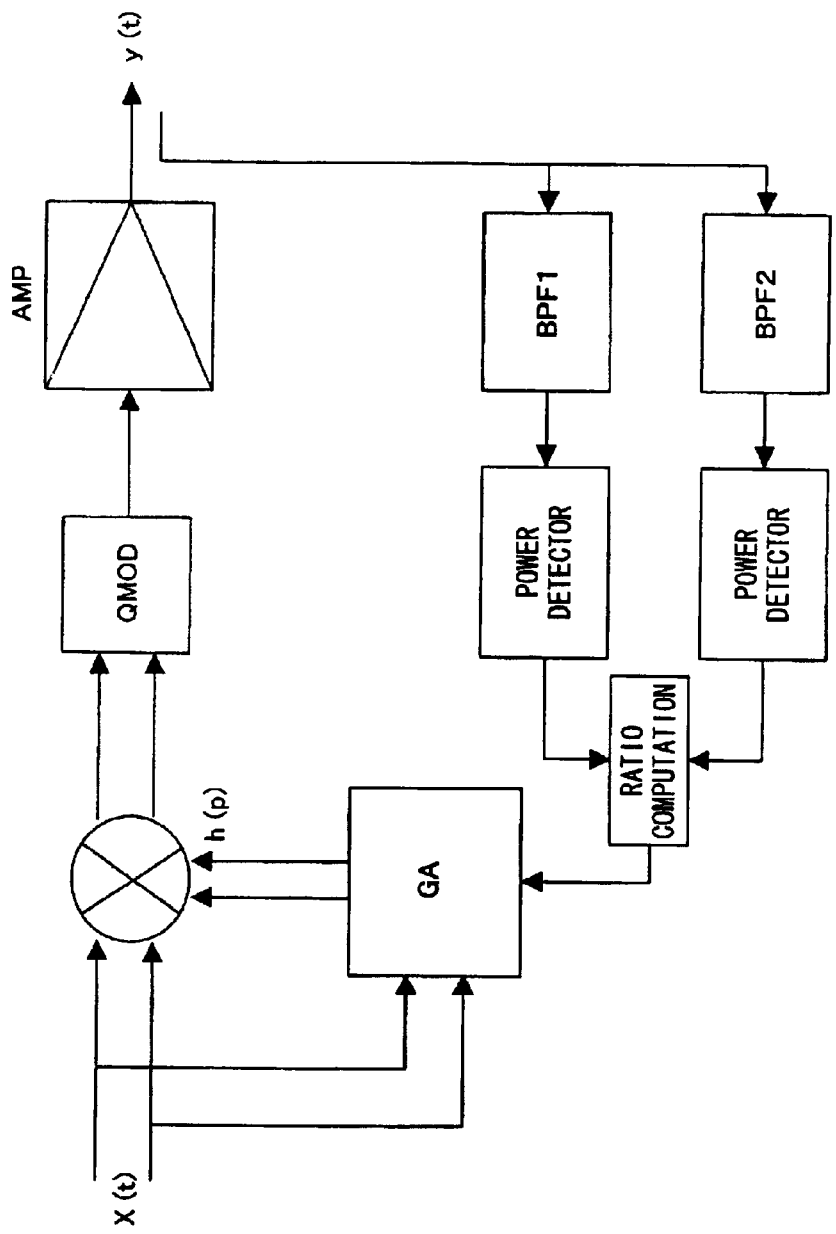
FIG. 15 shows an example of the seventh practical configuration of the distortion compensation apparatus according to an embodiment of the present invention.

FIG. 15 shows an example of the seventh practical configuration of the distortion compensation apparatus according to an embodiment of the present invention According to the practical example, a part of the output of the power amplifier AMP is received, the own signal band is extracted by a band pass filter BPF 1, and the signal of the adjacent channel band is extracted by a band pass filter BPF 2. The power detector measures the power $P_{bpf1}$ and $P_{bpf2}$ of the output of the band pass filters BPF. From the obtained power of each band, the adjacent channel leakage power ratio ACPR=$P_{bpf2}/P_{bpf1}$ is obtained as an evaluation function of the GA. The power detector is almost the same as the sixth practical example of the configuration. The type using the RSSI can obtain a value dB-converted as a power measurement value. However, in this case, the obtained adjacent channel leakage power ratio is represented by ACPR=$P_{bpf2}-P_{bpf1}$.

Figure 16:
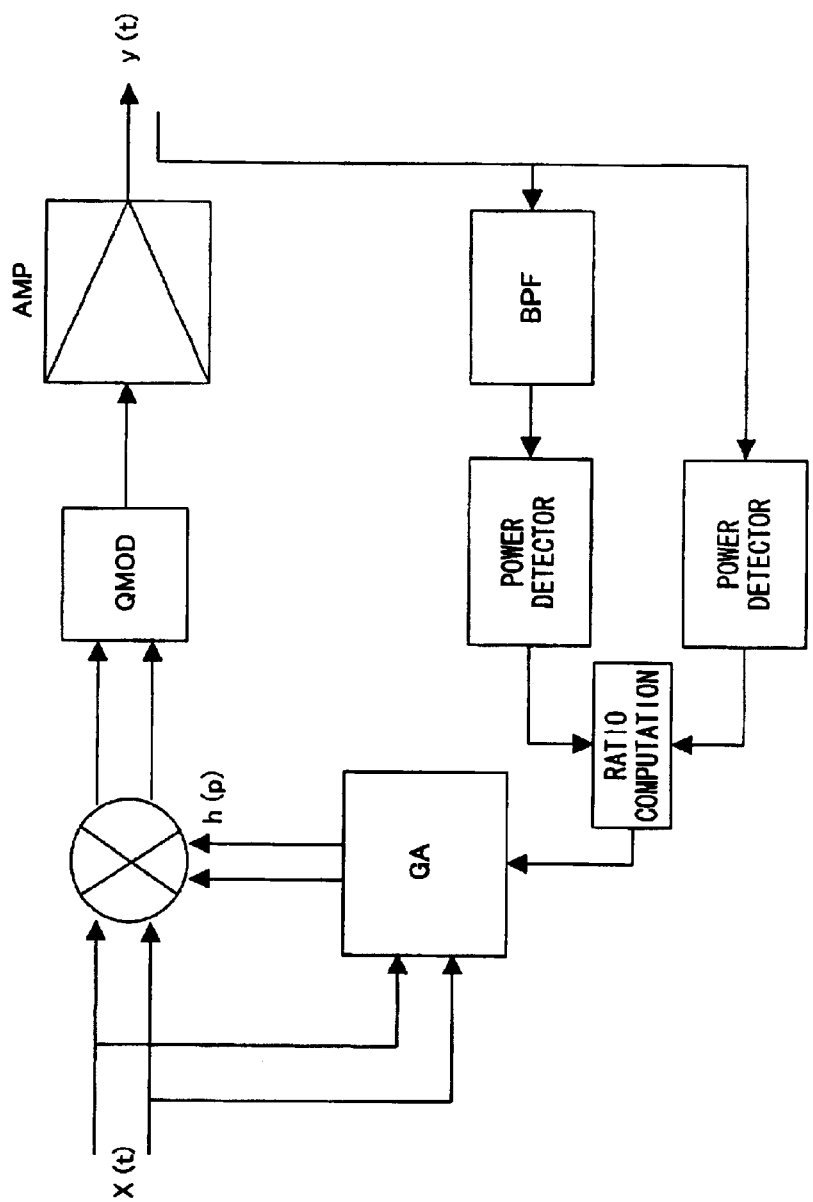
FIG. 16 shows an example of the eighth practical configuration of the distortion compensation apparatus according to an embodiment of the present invention.

FIG. 16 shows an example of the eighth practical configuration of the distortion compensation apparatus according to an embodiment of the present invention.

According to the practical example, a part of the output of the power amplifier is received, and a signal of the adjacent channel band is extracted by the BPF. Then, all output power $P_{all}$ of the power amplifier AMP and the output power $P_{bpf2}$ of the band pass filter BPF are measured using the power detector, and the adjacent channel leakage power ratio ACPR=$P_{bpf2}/P_{all}$ is computed as in the example of the seventh practical configuration.

Furthermore, according to an embodiment of the present invention, an individual having a predominant gene type of high adaptability survives others by repeating the succeeding generations of individuals indicating the distortion compensation coefficient by the GA. If the adaptability of each gene type is evaluated, and the adaptability exceeds a predetermined threshold, then the crossover rate of the gene type can be varied. For example, the crossover rate is set high at the beginning of the adapting process, and the rate can be set lower in the process of the adapting operation, thereby quickly detecting the optimum value, and enhancing the stability of the computed value by the GA when the optimum value is nearly reached.

The adaptability can be the average adaptability of the gene types of the individuals of the generation, the maximum adaptability of the generation, etc. Furthermore, there can be a plurality of thresholds for the switch of the crossover rate for the stepwise switching.

In addition, when the adaptability of each gene type is evaluated and the adaptability exceeds a predetermined threshold, the mutation rate can be effectively varied. For example, the mutation rate can be set high at the start of the adapting process, and can be set lower in the adapting process, thereby detecting the optimum value without being trapped by a local pseudo-optimum value, and enhancing the stability and suppressing the occurrence of an inappropriate gene type when the optimum value is being reached.

As described above, the adaptability can be an average adaptability of the generation, the maximum adaptability, etc. Furthermore, there can be a plurality of thresholds for the stepwise switch of the mutation rate.

Otherwise, when the adaptability of each gene type is evaluated and the adaptability exceeds a predetermined threshold, the speed (frequency) of the succeeding generations is varied. For example, the frequency of the succeeding generations is set high at the start of the adapting process, and is set lower in the adapting process, thereby reducing the arithmetic operations of the algorithm when the optimum value is reached after quickly searching for the optimum value.

The adaptability can be, as described above, an average adaptability of one generation, the maximum adaptability, etc. Additionally, there can be a plurality of thresholds for the stepwise switch of an intermittence rate. A variable intermittence rate includes the process up to the stop of succeeding generations.

The arithmetic method of the GA can be the concurrent evolution of an amplitude gene type and a phase gene type when the succeeding generations of the GA occur. That is, one succeeding generation occurs with the reproduction, crossover, and mutation of both genes.

Furthermore, in another method of the arithmetic operation of the GA, the gene type of the amplitude and the gene type of the phase are individually evolved. That is, in a succeeding generation, the reproduction, crossover, and mutation are performed only on the gene type of the amplitude with the gene type of the phase left as is (the gene type of the phase is the same as that of the current generation). In another succeeding generation, the gene type of the amplitude and the gene type of the phase are individually evolved. That is, in a succeeding generation, the reproduction, crossover, and mutation are performed only on the gene type of the phase with the gene type of the amplitude left as is.

Otherwise, the method of alternately applying the above mentioned process on each generation, or every several generations can be used. The frequencies of the succeeding generations of the amplitude and the phase do not always have to be the same as each other. For example, when the amplitude and the phase have different influences on an evaluation function, the optimum distortion compensation coefficient can be expected to be quickly obtained by more frequently having succeeding generations of the gene type which has a larger influence. Before installing the distortion compensation device, the level of the influence of the amplitude and phase on an evaluation function can be informed of in advance based on past experience.

Furthermore, the crossover rate, the mutation rate, and the intermittence rate can be set independent of the gene type of the amplitude or phase.

According to the present invention, an excellent distortion compensation characteristic can be realized independent of the device performance of an A/D converter using an adaptive predistorter for use with a power amplifier of a broad band and dynamic range signal.

Furthermore, according to the GA application method of the present invention, an optimum distortion compensation coefficient can be obtained quickly and stably.

What is claimed is:

1. A distortion compensation apparatus which compensates for a distortion characteristic of an amplifier, comprising:
   an adjacent channel leakage power extraction unit extracting at least adjacent channel leakage power of a main channel signal to be processed in a distortion compensating process from an output signal of the amplifier;
   a distortion compensation coefficient computation unit converting an amplitude value and a phase value of a distortion compensation coefficient into respective gene types, and obtaining the distortion compensation coefficient based on a genetic algorithm using the adjacent channel leakage power value or the adjacent channel leakage power ratio obtained from the adjacent channel leakage power value as an evaluation function; and
   a distortion compensation coefficient application unit applying the distortion compensation coefficient computed by said distortion compensation coefficient computation unit as an input signal of the amplifier.

2. The apparatus according to claim 1, wherein said gene type is generated for each of a power value of an input signal of the amplifier, an amplitude value, a function of the power value, or a value distinguished by a function value of the amplitude value.

3. The apparatus according to claim 1, wherein said gene type is given as a series represented by binary values indicating an amplitude and a phase value of the distortion compensation coefficient.

4. The apparatus according to claim 1, wherein said distortion compensation coefficient computation unit sequentially computes a distortion compensation coefficient from a largest value to a smallest value of a power value of an input signal to the amplifier.

5. The apparatus according to claim 1, wherein said distortion compensation coefficient computation unit computes all distortion compensation coefficients, and then repeats sequentially updating distortion compensation coefficients from a largest power value to a smallest power value of an input signal to the amplifier.

6. The apparatus according to claim 4, wherein said distortion compensation coefficient computation unit uses a gene type corresponding to a larger power value already obtained as an initial value of a gene type corresponding to the power value of the input signal, or a similar gene type.

7. The apparatus according to claim 2, wherein said distortion compensation coefficient computation unit sets a value for discrimination of the gene type as discrete values of a power value of the input signal, obtains a distortion compensation coefficient corresponding to the discrete values, and obtains a distortion compensation coefficient in an interpolating process for a power value between the discrete values.

8. The apparatus according to claim 1, wherein said distortion compensation coefficient computation unit obtains a distortion compensation coefficient corresponding to a power value of the input signal larger than a predetermined value using a genetic algorithm, and obtains a distortion compensation coefficient corresponding to a power value of the input signal smaller than the predetermined value in a method other than the genetic algorithm.

9. The apparatus according to claim 8, wherein said method other than the genetic algorithm uses the power value of the input signal as is.

10. The apparatus according to claim 8, wherein said method other than the genetic algorithm performs an interpolating process on the power value of the input signal.

11. The apparatus according to claim 1, wherein said distortion compensation coefficient application unit provides an amplitude value of the distortion compensation coefficient through a gain adjuster, and a phase value through a phase shifter for an input signal of the amplifier.

12. The apparatus according to claim 1, wherein said distortion compensation coefficient application unit complex-multiplies an input signal of the amplifier by the distortion compensation coefficient.

13. The apparatus according to claim 1, wherein said distortion compensation coefficient application unit obtains the distortion compensation coefficient as a complex difference signal between an input signal to the amplifier and a signal obtained after distortion compensation, and performs a distortion compensating process on the input signal by increasing/decreasing an original input signal using the difference signal.

14. The apparatus according to claim 1, wherein said adjacent channel leakage power extraction unit demodulates output of the amplifier, performs a Fourier transform on the demodulated output, and obtains an adjacent channel leakage power value or an adjacent channel leakage power ratio.

15. The apparatus according to claim 1, wherein said adjacent channel leakage power extraction unit demodulates output of the amplifier, and obtains an adjacent channel leakage power value or an adjacent channel leakage power ratio from the demodulated output using a digital filter.

16. The apparatus according to claim 1, wherein said adjacent channel leakage power extraction unit passes output of the amplifier through a band pass filter, and obtains a detection result through a power detector, thereby obtaining an adjacent channel leakage power value or an adjacent channel leakage power ratio.

17. The apparatus according to claim 1, wherein said adjacent channel leakage power extraction unit varies a crossover rate of the genetic algorithm according to adaptability of the gene type.

18. The apparatus according to claim 1, wherein said adjacent channel leakage power extraction unit varies a mutation rate of the genetic algorithm according to adaptability of the gene type.

19. The apparatus according to claim 1, wherein
said adjacent channel leakage power extraction unit varies a frequency of succeeding generations of the genetic algorithm according to adaptability of the gene type.

20. A distortion compensating method for compensating for a distortion characteristic of an amplifier, comprising:

extracting at least adjacent channel leakage power of a main channel signal to be processed in a distortion compensating process from an output signal of the amplifier;

converting an amplitude value and a phase value of a distortion compensation coefficient into respective gene types, and obtaining the distortion compensation coefficient based on a genetic algorithm using the adjacent channel leakage power value or the adjacent channel leakage power ratio obtained from the adjacent channel leakage power value as an evaluation function; and applying the distortion compensation coefficient computed in said distortion compensation coefficient computing step as an input signal of the amplifier.

\* \* \* \* \*